United States Patent
Evain et al.

(10) Patent No.: US 9,515,682 B2
(45) Date of Patent: Dec. 6, 2016

(54) DEVICE FOR CORRECTING TWO ERRORS WITH A CODE OF HAMMING DISTANCE THREE OR FOUR

(71) Applicant: COMMISSARIAT A L'ENERGIE ATOMIQUE ET AUX ENERGIES ALTERNATIVES, Paris (FR)

(72) Inventors: Samuel Evain, Saclay (FR); Valentin Gherman, Palaiseau (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 73 days.

(21) Appl. No.: 14/411,081

(22) PCT Filed: Jun. 26, 2013

(86) PCT No.: PCT/EP2013/063407
§ 371 (c)(1),
(2) Date: Dec. 23, 2014

(87) PCT Pub. No.: WO2014/001397
PCT Pub. Date: Jan. 3, 2014

(65) Prior Publication Data
US 2015/0341056 A1 Nov. 26, 2015

(30) Foreign Application Priority Data

Jun. 26, 2012 (FR) ...................................... 12 56029
Aug. 10, 2012 (FR) ...................................... 12 02225

(51) Int. Cl.
*H03M 13/00* (2006.01)
*H03M 13/29* (2006.01)
(Continued)

(52) U.S. Cl.
CPC .......... *H03M 13/2906* (2013.01); *G06F 11/10* (2013.01); *H03M 13/159* (2013.01); *H03M 13/453* (2013.01)

(58) Field of Classification Search
CPC ............ H03M 13/2906; H03M 13/159; H03M 13/453; G06F 11/10
See application file for complete search history.

(56) References Cited

U.S. PATENT DOCUMENTS

| 2001/0025359 A1* | 9/2001 | Tanaka .................... G06F 11/10 714/753 |
| 2007/0214402 A1 | 9/2007 | Heiman et al. |
| 2010/0017684 A1 | 1/2010 | Yang |

OTHER PUBLICATIONS

L Baccarini, et al., "Error-Correction Techniques and Adaptive Linerization in SDH Radio", European Conference on Radio Relay Systems, Oct. 11-14, 1993, pp. 238-243, vol. Conf. 4, IEE, London, GB, XP006513627.

(Continued)

*Primary Examiner* — Sam Rizk
(74) *Attorney, Agent, or Firm* — Baker & Hostetler LLP (57) ABSTRACT

A device for correcting an initial binary word affected by an error in 1 or 2 bits and arising from a corrector code endowed with a minimum Hamming distance of 3 or 4, comprises first means for correcting an error of 1 bit and for detecting an error of more than 1 bit in the initial word and second means for correcting an error of 1 bit in a word arising from an inversion module, able to receive a datum indicative of a binary level of confidence, low or high, assigned to each of the bits of at least one part of the initial word, said inversion module being configured to invert the bits of the initial word which suffer the low confidence level, and a multiplexer with at least two inputs which is driven by the means for detecting an error of more than 1 bit in the initial word, said multiplexer being fed on a first input by the (Continued)

output of the first correction means and on a second input by the output of the second correction means.

7 Claims, 6 Drawing Sheets

(51) Int. Cl.
*G06F 11/10* (2006.01)
*H03M 13/15* (2006.01)
*H03M 13/45* (2006.01)

(56) References Cited

OTHER PUBLICATIONS

Richard A. Silverman, et al., "Coding for Constant-Data-Rate Systems", IRE Professional Group on Information Theory, Sep. 1954, pp. 50-63, vol. 1, No. 4, IEEE, USA, XP011217036.

* cited by examiner

DEVICE FOR CORRECTING TWO ERRORS WITH A CODE OF HAMMING DISTANCE THREE OR FOUR

CROSS-REFERENCE TO RELATED APPLICATIONS

This application is a National Stage of International patent application PCT/EP2013/063407, filed on Jun. 26, 2013, which claims priority to foreign French patent application No. FR 1256029, filed on Jun. 26, 2012, and foreign French patent application No. FR 1202225, filed on Aug. 10, 2012, the disclosures of which are incorporated by reference in their entirety.

FIELD OF THE INVENTION

The subject of the invention is a device and a method for the correction of errors affecting at least one bit in a code word, the number of whose check bits allows the correction of single errors (that is to say affecting a single bit) and, optionally, the detection of double errors (that is to say errors affecting two bits). More generally, the invention proposes a device judiciously utilizing confidence information about the bits of a code word to be corrected so as to correct errors of n or more bits in this word, the code being provided with a minimum Hamming distance of less than or equal to 2n, the device also ensuring the correction of all the errors affecting fewer than n bits. The invention applies notably to the fields of error correcting codes and nanometric technologies.

BACKGROUND

In a digital system, the data are customarily stored and/or transmitted in the form of binary values called bits. These data may be affected by faults which may give rise to operating errors and ultimately the failure of the system in the absence of any correction mechanism or masking.

In order to guarantee an acceptable level of integrity for the data stored or transmitted, certain electronic systems use codes, customarily designated by the acronym ECC standing for the expression "Error Correcting Codes". For this purpose, the data are encoded during the writing of said data to a storage system or during the transmission of said data through a system of interconnections. During the encoding of the data with an ECC code, check bits are added to the data bits so as to form code words.

In order to allow the correction of errors which affect up to n bits in the words of an ECC code, these code words must be separated by a minimum Hamming distance of 2n+1. To also allow the detection of errors which affect N+1 bits, apart from the correction of the errors affecting up to n bits, in the code words of an ECC, these code words must be separated by a minimum Hamming distance of 2n+2.

The code words of a linear corrector code are defined with the aid of a control matrix H. A binary vector V is a code word only if its product with the matrix H generates a zero vector. A code word V of a linear corrector code is checked by evaluating the matrix product H·V. The result of this operation is a vector called a syndrome. If the syndrome is a zero vector, the code word V is considered to be correct. A non-zero syndrome indicates the presence of at least one error. If the syndrome makes it possible to identify the positions of the affected bits, the errors affecting the code word can be corrected.

Various linear ECC codes exist with different error detection and correction capabilities. By way of example, a Hamming code makes it possible to correct a single error, that is to say an error which affects a single bit. This correction capability is dubbed SEC, the acronym standing for the expression "Single Error Correction". The words of an SEC code are separated by a minimum Hamming distance of 3.

Another example of ECC code is the DEC code, the acronym standing for the expression "Double Error Correction", which allows the correction of double errors, that is to say of errors affecting two bits in a code word. Quite obviously, the codes of this family are also capable of correcting all single errors. The words of a DEC code are separated by a minimum Hamming distance of 5.

This difference between the correction capability of an SEC code and that of a DEC code is due to an increase in the number of check bits in the case of a DEC code. For example, for eight data bits an SEC code needs four check bits while a DEC code needs eight check bits. Such a 100% increase in the number of check bits may be prohibitive because of the impact on the area of the components, their efficiency, their consumption and ultimately their cost.

Now, memories manufactured with the aid of emerging technologies, such as MRAMs, the acronym standing for the expression "Magnetic Random Access Memory", may be affected by a significant rate of transient and/or permanent errors. For these types of memories, the correction capability of SEC codes is too low and DEC codes remain too expensive. In such situations, innovative masking solutions and/or corrections are necessary.

SUMMARY OF THE INVENTION

An aim of the invention is notably to propose means for correcting a single error or a multiple error in a code word whose minimum Hamming distance is equal to 3 or 4.

For this purpose, the subject of the invention is a device for correcting an initial binary word affected by an error in 1 or 2 bits and arising from a corrector code endowed with a minimum Hamming distance of 3 or 4, the device comprising first means for correcting and detecting an error of 1 bit and an error of more than 1 bit in the initial word and second means for correcting an error of 1 bit in a word arising from an inversion module, said inversion module being able to receive a datum indicative of a binary level of confidence, low or high, assigned to each of the bits of at least one part of the initial word, said inversion module being configured to invert the bits of the initial word which suffer the low confidence level, and a multiplexer with at least two inputs which is driven by the first means for correcting and detecting an error of more than 1 bit in the initial word, said multiplexer being fed on a first input by the output of the second correction and detection means and on a second input by the output of the second correction and detection means, said first means for correcting and detecting being adapted to generate a signal of command in order to choose the output of said second means for correcting and detecting when the first means for correcting and detecting indicates that an error that cannot be corrected appears and in contrary the output of the second means for correcting and detecting to be chosen.

The device according to the invention thus makes it possible to correct errors of 1 or 2 bits in code words whose minimum Hamming distance is 3 or 4, the device also ensuring the correction of all errors affecting fewer than n bits. This device makes it possible to reduce the number of redundancy bits used by the code. A fortiori, the device also operates for codes whose words are separated by a minimum Hamming distance of greater than 2n, even if its use is then of more limited benefit. The inversion module acts as an "a priori" correction module, the detection means being used to select the word to be provided as output between that which arises from the inversion and the initial word optionally corrected of an error in n−1 bits. According to another embodiment of the device according to the invention, the inversion module is activated only when an error of at least n bits is detected by the detection means. In a preferred embodiment, the detection is performed in parallel with the inversion of bits.

The device for correcting an initial word can comprise second means for correcting and detecting errors of more than 1 bit which are fed with the word arising from the inversion module, the outputs of the two detection means being combined to generate a signal indicating an uncorrectable error when the two detection means have detected an error of more than 1 bit.

According to a variant embodiment of the device, the means for detecting an error of more than 1 bit are configured to detect errors affecting more than two bits which are characterized by a non-zero syndrome which is different to the syndromes corresponding to a single error.

According to one embodiment of the device in which n is equal to 2, the second means for correcting an error of n−1 bits are bundled in the form of an SEC decoder.

When the device for n equal to 2 comprises second means for detecting an error of more than n−1 bits which are fed with the word arising from the inversion module and when the minimum Hamming distance between the code words is equal to 4, the second detection means and the second correction means can be bundled in the form of an SEC-DED ("Single Error Correction-Double Error Detection") decoder.

Similarly, according to an embodiment of the device for correcting an initial word according to the invention, in which n is equal to 2 and the minimum Hamming distance between the code words is equal to 4, the means for detecting an error of more than n−1 bits in the initial word and the means for correcting an error of n−1 bits in the initial word are bundled in the form of an SEC-DED decoder. According to another embodiment of the device for correcting an initial word according to the invention, in which n is equal to 2 and the minimum Hamming distance between the code words is equal to 3, the means for detecting an error of more than n−1 bits in the initial word and the means for correcting an error of n−1 bits in the initial word are bundled in the form of an SEC decoder with detection of certain double errors.

According to a particular embodiment of the invention, the device for correcting an initial word affected by a single error or by a double error and arising from a corrector code endowed with a minimum Hamming distance equal to 4 comprises an input adapted to receive a datum indicative of the confidence assigned to each of the bits of at least one part of the initial word, said device comprising at least two decoders, a module for inverting the bits and a multiplexer, an SEC-DED decoder receiving as input the initial word, an SEC decoder or an SEC-DED decoder receiving as input the output of the inversion module, said inversion module receiving as inputs said datum indicative of confidence and the initial word, the multiplexer choosing between the outputs of the decoders, the output of the SEC decoder or of the SEC-DED decoder being chosen when the SEC-DED decoder indicates the occurrence of a double error, the multiplexer being controlled by a signal provided by the SEC-DED decoder indicating the presence of a double error, the multiplexer delivering the corrected word as output. This device makes it possible to correct single errors and double errors, although the minimum Hamming distance of the code used is only equal to 4.

In the devices mentioned hereinabove, the SEC-DED decoders can be constructed so as to also ensure the detection of errors affecting more than two bits which are characterized by a non-zero syndrome which is different to the syndromes corresponding to a single error. Thus these devices can ensure the correction of all the detectable errors, some of which affect more than two bits.

The subject of the invention is also a memory module comprising a device such as described above, the memory module thus benefiting from efficacious means of error correction at lesser cost, since the storage of numerous redundancy bits is avoided.

BRIEF DESCRIPTION OF THE DRAWINGS

Other characteristics and advantages of the invention will become apparent with the aid of the description which follows, given by way of nonlimiting illustration and with regard to the appended drawings among which.

DETAILED DESCRIPTION

Figure 1:
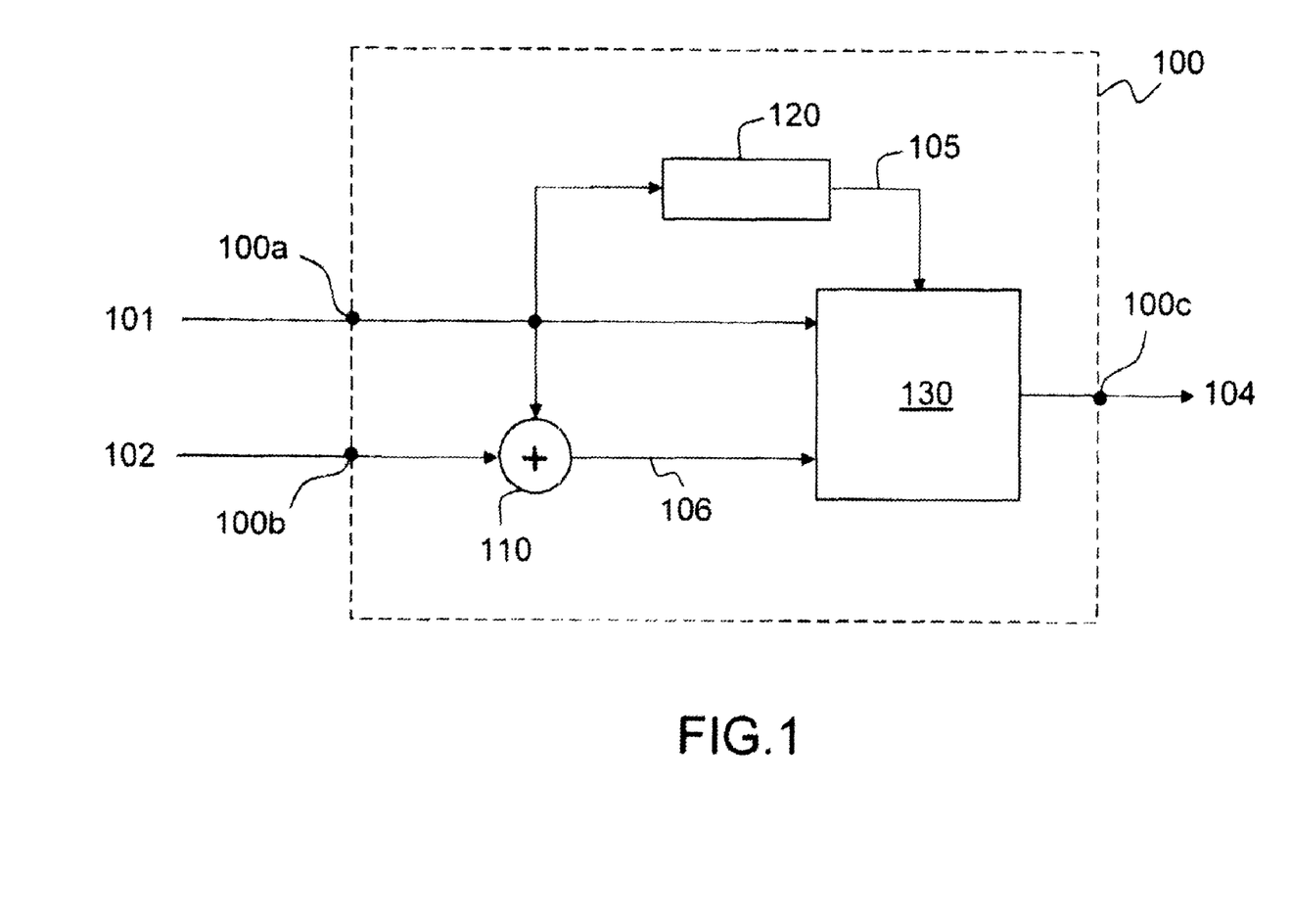
FIG. 1 is a basic diagram illustrating the structure of a device according to the invention.

FIG. 1 presents a basic diagram of a device according to the invention able to correct errors of n or more bits in a word 101 of a code characterized by a minimum Hamming distance which does not exceed 2n. This device also ensures the correction of all errors affecting fewer than n bits.

Hereinafter, it is considered that a datum indicative of confidence, in the example in the form of a word 102, is used to indicate a binary level of confidence of each bit in a potentially erroneous code word 101, termed the initial word 101, at the input of the proposed devices. In the examples developed, these words 101 and 102 comprise the same number of bits. Without affecting the generality of the invention, subsequently, it is also considered that in the confidence word 102, a bit with the 1-logic value signals that the corresponding bit in the code word 101 has a low confidence level, a bit with the 0-logic value signaling a bit with a high confidence level.

The device 100 receives on a first input 100a an initial word 101 and on a second input 100b a confidence word 102 comprising the binary information relating to the confidence level of each bit in the initial word 101. The device 100 delivers a corrected word 104 as output 100c. It comprises bit inversion means 110 fed with the initial word 101 and the confidence word 102, means 120 for detecting an error of n or more bits in the initial word 101 driving multiplexing and correction means 130.

The means for inverting bits 110 are able to invert the bits of the initial word 101 which are affected of a low confidence level. In the example, the means for inverting bits comprise a module operating an "exclusive or" on the incoming words 101 and 102. Thus, all the bits marked as low by a 1-logic are inverted, so as to provide an intermediate word 106.

The detection means 120 make it possible to generate a drive signal 105 whose value is different depending on whether they detect an error in at least n bits of the initial word 101. Thus if the detection means 120 do not detect any error or if they detect an error in n−1 or fewer bits, then the drive signal 105 takes a first value; if the detection means 120 detect an error in more than n−1 bits, then the drive signal 105 takes a second value.

The multiplexing and correction means 130 are fed, on the one hand with the initial word 101, and on the other hand with the intermediate word 106 arising from the inversion means 110. Furthermore, these means 130 are driven by the drive signal 105 arising from the detection means 120 so as to deliver a corrected word 104 determined as a function of the initial word 101 when the drive signal 105 is at the first value—stated otherwise when no error of more than n−1 bits has been detected in the initial word 101—, and to deliver a corrected word 104 determined as a function of the intermediate word 106 when the drive signal 105 is at the second value—stated otherwise when an error of at least n bits has been detected in the initial word 101. The multiplexing and correction means 130 comprise means for correcting an error in maximum n−1 bits so as to correct at least one such error when it is present in the initial word 101 or in the intermediate word 106. As illustrated further on, notably in FIG. 3, these correction means can be associated in the same physical module with the aforementioned detection means 120. The correction and multiplexing means 130 do not necessarily correspond to a distinct physical module.

Figure 2A:
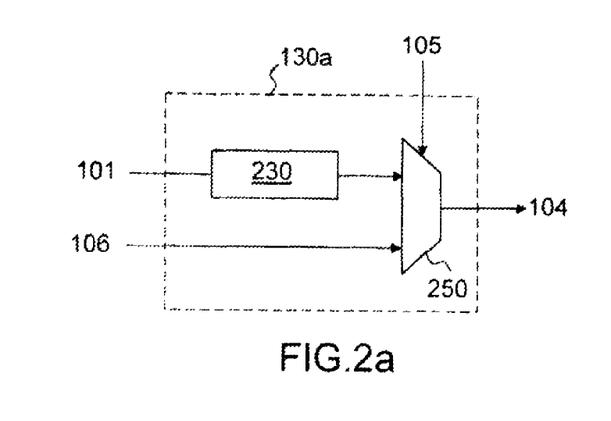
FIGS. 2a, 2b, 2c illustrate several possible implementations of the multiplexing and correction means included in a device such as that presented in FIG. 1.
Figure 2B:
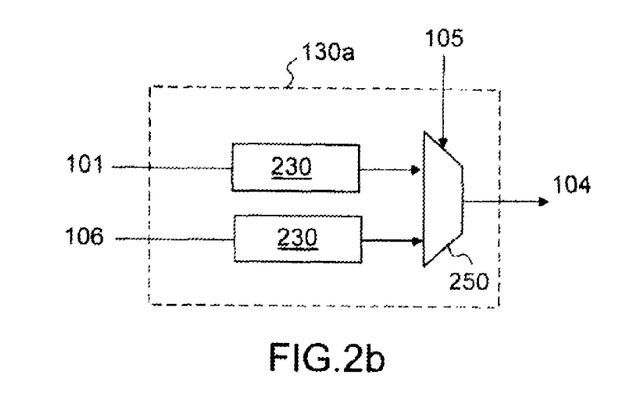
Figure 2C:
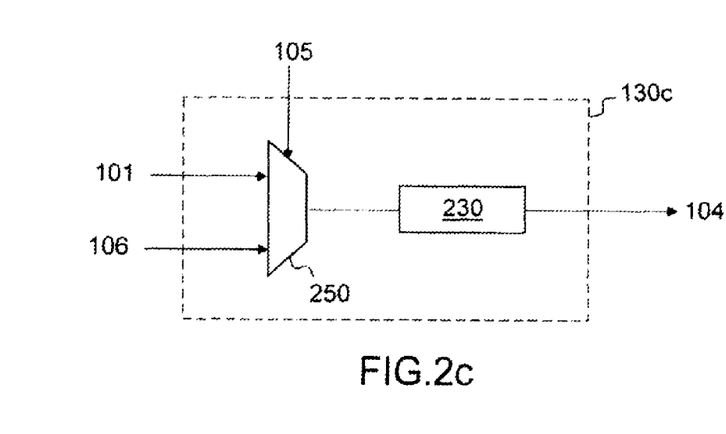

FIGS. 2a, 2b, 2c illustrate several possible implementations of the multiplexing and correction means 130 introduced in FIG. 1. These implementations are presented purely by way of nonlimiting illustration.

FIG. 2a presents first multiplexing and correction means 130a comprising a multiplexer 250 with two inputs driven by the drive signal 105 arising from the detection means such as illustrated in FIG. 1 (reference 120). The means 130a also comprise means for correcting an error in maximum n−1 bits, 230, placed on the first input of the multiplexer 250 and fed with the initial word 101. The multiplexer 250 is fed on its second input with the intermediate word 106. Thus, in a first case where no error of more than n−1 bits has been detected in the initial word 101, the drive signal 105 selects the first input of the multiplexer 205 to deliver as output 104 the initial word 101 corrected of a possible error in maximum n−1 bits; in a second case where an error of at least n bits has been detected in the initial word 101, the drive signal 105 selects the second input of the multiplexer 250 to deliver the intermediate word 106 as output 104. The double error correction is therefore performed by the inversion of bits. It should be noted that in this embodiment the corrected word 104 delivered as output may still be affected by an error, notably in the case where the initial word is affected by an error in n bits and the confidence word 102 indicates a number of bits with low confidence level different from n. Indeed, in this case, the inversion module 110 modifies an insufficient or overly high number of bits, producing an intermediate word 106 still affected by an error despite the inversion of bits.

FIG. 2b proposes an embodiment alleviating the aforementioned drawbacks of the embodiment of FIG. 2a. The multiplexing and correction means 130b of FIG. 2 comprise a multiplexer 250 with two inputs driven by the drive signal 105. The means 130b also comprise first means for correcting an error of n−1 bits 230 placed on the first input of the multiplexer 250 and fed with the initial word 101 and second means for correcting an error of n−1 bits 230 placed on the second input of the multiplexer 250 and fed with the intermediate word 106. Thus, in a first case where no error of more than n−1 bits has been detected in the initial word 101, the drive signal 105 selects the first input of the multiplexer 205 to deliver as output 104 the initial word 101 corrected of a possible error in maximum n−1 bits; in a second case where an error of at least n bits has been detected in the initial word 101, the drive signal 105 selects the second input of the multiplexer 250 to deliver as output 104 the intermediate word 106 corrected of a possible residual error in maximum n−1 bits.

FIG. 2c presents an embodiment of the multiplexing and correction means 130c comprising a multiplexer 250 with two inputs driven by the drive signal 105. The multiplexer 250 is fed on its first input with the initial word 101 and on its second input with the intermediate word 106. A module for correcting a maximum error of n−1 bits 230 is placed at the output of the multiplexer 250, so that whatever the word selected as input—initial word 101 or intermediate word 106—, the latter is submitted to the correction module 230. This embodiment constitutes only an example of mutualization of the correction means. It should be noted that the embodiment of FIG. 2b may sometimes be preferred to that of FIG. 2c since it decreases the latency of the proposed devices by making it possible to calculate the drive signal 105 in parallel with the possible corrections performed in the modules 230.

Figure 3:
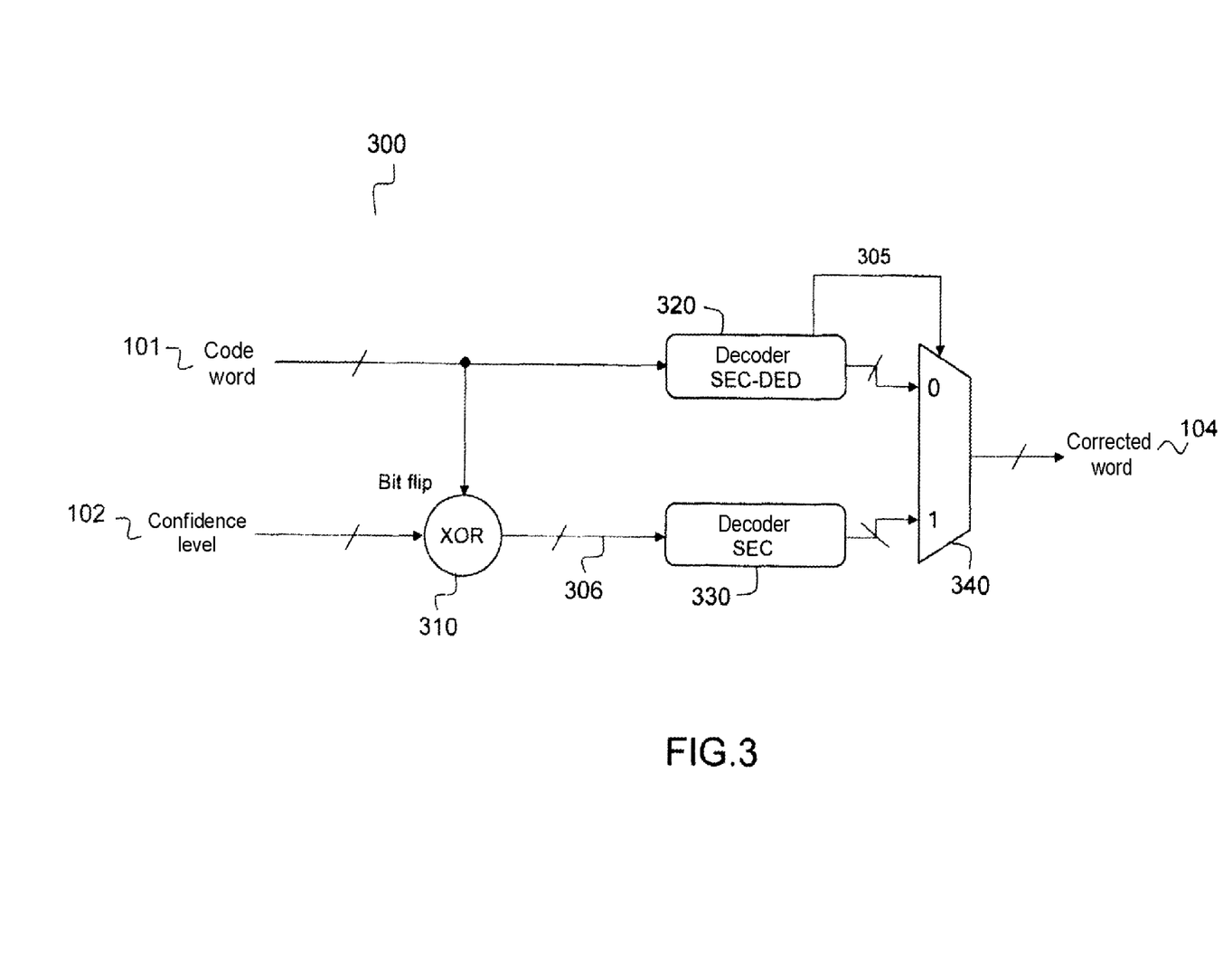
FIG. 3 is a first embodiment of a device according to the invention able to correct single and multiple errors in an initial code word provided with a minimum Hamming distance of 3 or 4.

FIG. 3 presents a first embodiment of a device according to the invention. The device 300 allows notably the correction of single and multiple errors (that is to say affecting a number of bits at least equal to 2) in an initial word 101 of a code characterized by a minimum Hamming distance of 3 or 4 (stated otherwise, n is equal to 2 to re-employ the principle described above with regard to FIG. 1). The use of a minimum Hamming distance equal to 4 allows an SEC-DED decoder to correct single errors (that is to say when a single bit is erroneous) and to detect double errors (in the case where two bits are erroneous). Furthermore, if and the code to which the initial word 101 belongs is imperfect and characterized by a minimum Hamming distance equal to 3, then a non-zero fraction, but different from 100%, of double errors can be detected. This device 300 also receives a word 102 comprising an item of information relating to the confidence level of each bit in the code word 101.

The device 300 comprises an SEC-DED ("Single Error Correction—Double Error Detection") decoder 320 fed with an initial word 101, a module for inverting bits 310 fed with the initial word 101 and the confidence word 102, an SEC ("Single Error Correction") decoder fed by the module for inverting bits 310 and a multiplexer 340 driven by the SEC-DED decoder 320 on the one hand, and on the other hand by the SEC decoder 330.

The SEC-DED decoder 320 is configured to receive as input a code word 101, termed the initial word 101, certain bits of which may be erroneous. The structure of the device 300 corresponds to the case presented in FIG. 2b where the error correcting modules are placed on each of the inputs of the multiplexer. To make the link with the basic diagrams presented in FIGS. 1 and 2b, the SEC-DED decoder 320 of the device 300 cumulatively ensures the functions fulfilled, on the one hand by the detection module 120 (cf. FIG. 1), and on the other hand by a correction module 230 included in the correction and multiplexing means 130 (cf. FIG. 2b). These correction and multiplexing means 130 correspond in FIG. 3 to the association of the multiplexer 340 with the SEC decoder 330 and the part of the SEC-DED decoder 320 responsible for correcting single errors. The SEC-DED decoder 320 makes it possible to generate a drive signal 305 to control the multiplexer 340, and it also makes it possible to correct single errors in the initial word 101 before the latter is transmitted to a first input of the multiplexer 340.

The module for inverting bits 310 operates according to the principle already described above so as to generate an intermediate word 306 by inverting the bits of low confidence of the initial word 101. Advantageously, the inversion module 310b contains logic gates operating an xor ("exclusive or") between each bit in the initial word 101 and the corresponding bit in the confidence word 102.

The SEC decoder 330 is fed with the intermediate word 306 arising from the inversion module 310, so that the SEC decoder 330 can correct a single error present in the intermediate word 306.

The multiplexer 340 is configured to choose between the output of the SEC-DED decoder 320 and the output of the SEC decoder 330 the word which is transmitted by the output 104 of the device 300. By virtue of the drive signal 305 generated by the SEC-DED 320, the output of the SEC decoder 330 is chosen only when the SEC-DED decoder 320 indicates the occurrence of an uncorrectable error, that is to say in the example an error other than a single error (in this case a double error); in the converse case, the output of the SEC-DED decoder 320 is chosen. The drive signal 305 takes for example the 1-logic value when the SEC-DED decoder 320 indicates the presence of an uncorrectable error. In all cases, the multiplexer 340 delivers as output a corrected word 104, even if in rare cases, corresponding for example to cases where the initial word was affected with numerous low-confidence bits, the device according to the invention does not succeed in generating a corrected word 104 devoid of errors.

The realization of the SEC-DED decoder 320 and SEC decoder 330 is not detailed since it is known to the person skilled in the art.

Figure 4:
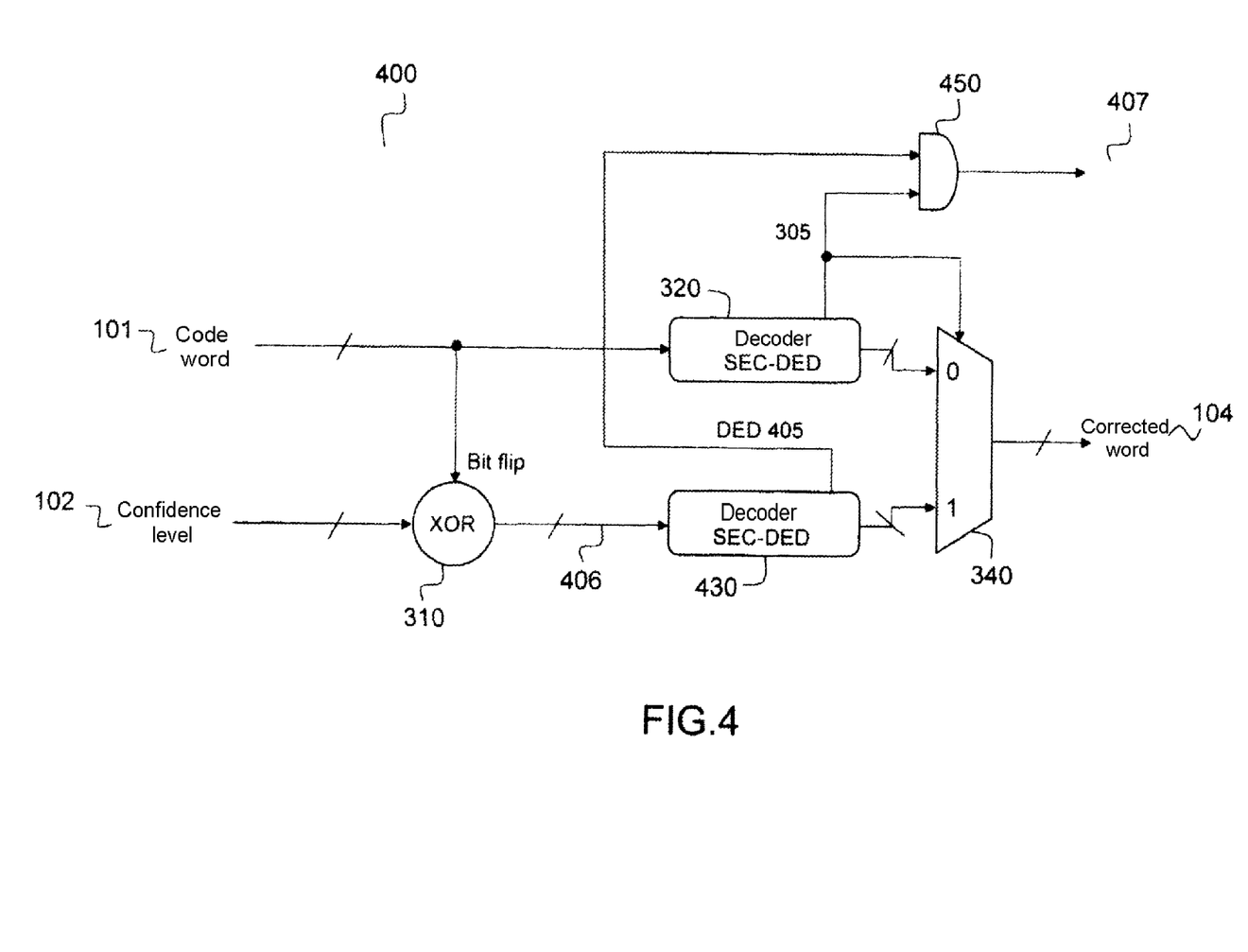
FIG. 4 is a variant embodiment of the device presented in FIG. 3 able to detect errors that could not be corrected by the device.

FIG. 4 illustrates a variant embodiment of the device presented in FIG. 3 furthermore allowing the detection of errors that could not be corrected. The device 400 comprises, with respect to the device of FIG. 3, an additional output 407 indicating the presence or otherwise of an error that could not be corrected by the device.

With respect to the device presented in FIG. 3, the SEC decoder 330 is replaced with an SEC-DED decoder 430 which has the same properties as the SEC-DED decoder 320 presented above. As in FIG. 3, the bits of the code word 101 are inverted by the module 310 as a function of the bits contained in the word 102, the confidence indicator, to give the bits of the intermediate word 406, which is transmitted to the SEC-DED decoder 430. This SEC-DED decoder 430 is configured to emit an error signal 405 when it detects an uncorrectable error. This error signal 405 is combined with the drive signal 305 emitted by the first SEC-DED 320 to generate an output signal 407 indicating an error uncorrectable by the device.

The signals 305 and 405 take for example the 1-logic value only when the SEC-DED decoder 320 and, respectively, SEC-DED decoder 430, indicate the presence of an error which has not been corrected. These signals 305 and 405 can be combined by a "logic-and" operation 450 to produce the error signal 407 at the output of the device.

The devices illustrated in FIGS. 3 and 4 can correct a double error if at least one of the two bits affected by this double error in the initial word 101 is indicated by the word 102 as having a low confidence level. In the case where only one of these two bits is indicated as having a low confidence level, it is necessary that it be the only bit in the whole code word 101 which is indicated as such, in order for the double error to become correctable.

In the devices illustrated in FIGS. 3 and 4, the SEC-DED decoders can be constructed so as to also ensure the detection of errors affecting more than two bits and which are characterized by a non-zero syndrome which is different to the syndromes corresponding to a single error. Thus these devices can ensure the correction of all the detectable errors, some of which affect more than two bits.

Figure 5:
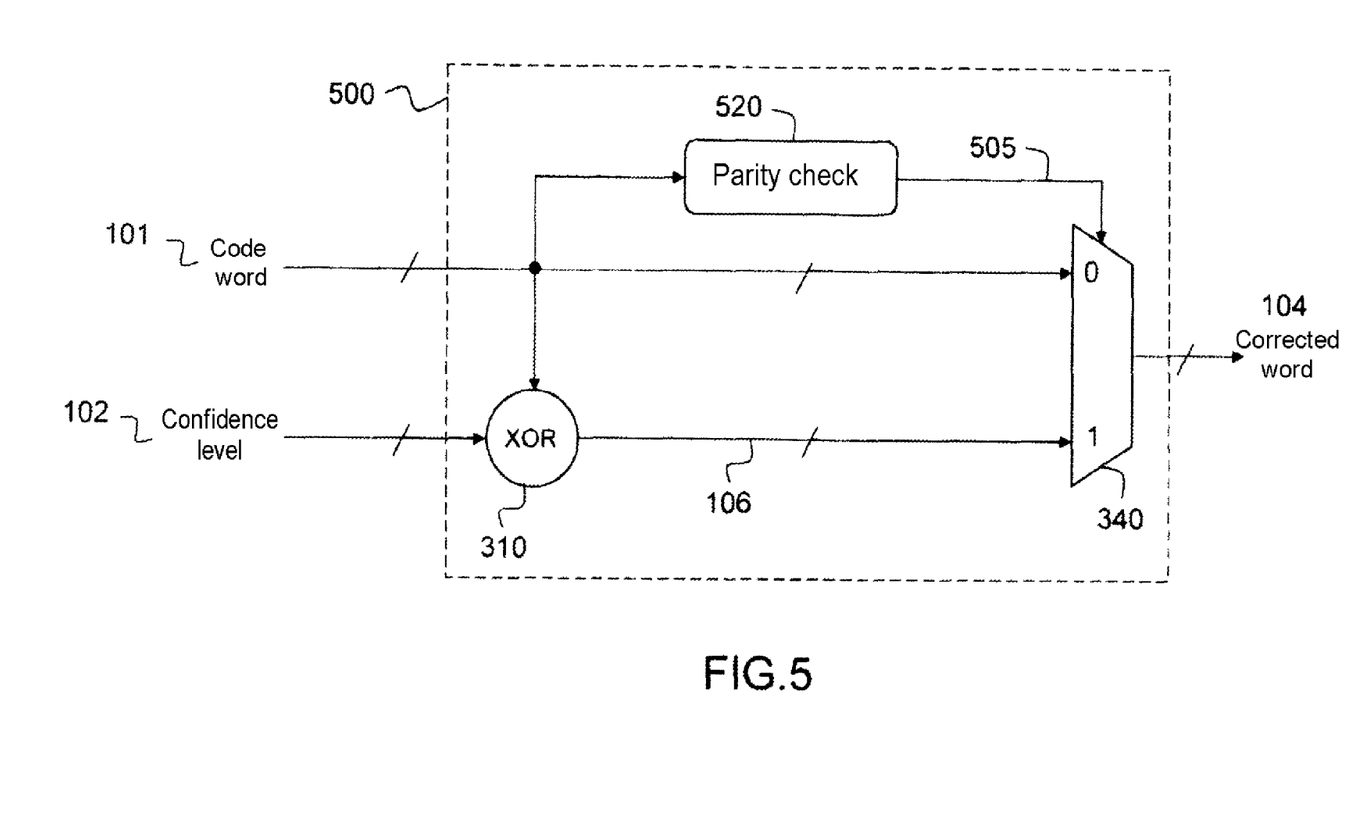
FIG. 5 is an exemplary device according to the invention able to correct single errors in a code word provided with a minimum Hamming distance of 2.

FIG. 5 presents an exemplary device according to the invention for the correction of single errors in a code word 101 containing a parity or imparity bit which guarantees the same parity for all the code words without errors, that is to say code words separated by a minimum Hamming distance of 2 (stated otherwise, n is equal to 1 to re-employ the principle described above with regard to FIG. 1). This device 500 also receives a word 102 comprising an item of information relating to the confidence level of each bit in the code word 101.

The device 500 of FIG. 5 comprises at least an inversion module 310, a multiplexer 340 and a parity check module 520. The inversion module 310 and the multiplexer 340 fulfill the same functions as in the previous figures.

The parity check module 520 is configured to determine the total parity of the initial word 101 and to generate a parity signal 505 to drive the multiplexer 340. The output 505 of the module 520 takes for example the 1-logic value only when the parity of the initial word 101 does not correspond to the parity of a code word without errors. A person skilled in the art can readily identify all the necessary modifications in the case where the values of this output 505 are inverted. The output of the inversion module 310 is chosen by the multiplexer 340 only when the control signal 505 indicates a disparity between the current parity and the expected parity of the initial word 101 therefore the occurrence of an error; in the converse case the initial word 101 is chosen for the output 104 of the device 500. The multiplexer 340 delivers as output the corrected word 104, optionally excluding the parity bit.

With respect to the device of FIG. 3, the SEC decoder 330 is replaced with a "0-bit corrector", stated otherwise a wire (the wire on which the word 106 arising from the inversion module 310 travels to feed the multiplexer 340). Likewise, instead of transmitting the initial word 101 to an SEC-DED decoder 320, the initial word 101 is transmitted to the multiplexer by a wire (0-bit corrector). To make the link with the basic diagrams presented in FIGS. 1 and 2b, the module for checking the parity 520 corresponds to the detection module 120 (cf. FIG. 1) and the correction module 230 (cf. FIGS. 2a, 2b, 2c) corresponds to a 0-bit corrector, that is to say a wire.

Figure 6:
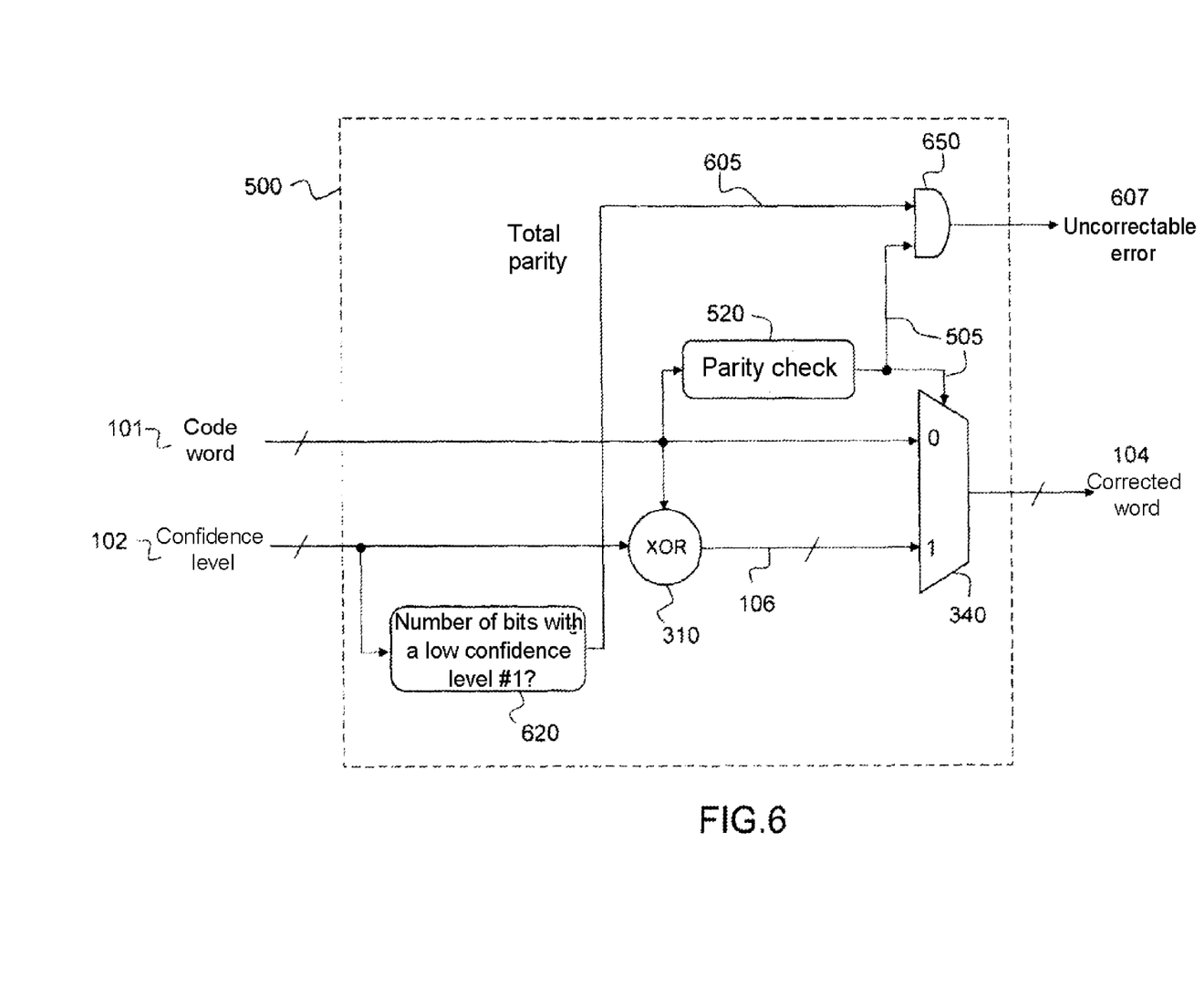
FIG. 6 is a variant of the device of FIG. 5 able to detect single errors that could not be corrected by the device.

FIG. 6 illustrates a variant of the device of FIG. 5 which also allows the detection of single errors that could not be corrected.

With respect to the device 500 presented in FIG. 5, the device 600 comprises moreover a test module 620 so as to check whether the confidence-indicating word 102 indicates a single bit with a low confidence level in the code word 101. The output 605 of the module 620 takes for example the 0-logic value only when the confidence word 102 indicates the presence of a single bit with a low confidence level in the code word 101.

In the example, the outputs of the parity check module 520 and test module 620 are combined in a module 650 implementing a logic-and operation. The output 607 of the logic-and module 650 thus makes it possible to indicate the presence of an error which has not been corrected.

Advantageously, the inversion, multiplexing, decoding modules which are used in the embodiments presented of the device according to the invention are standard modules known from the prior art. Furthermore, the person skilled in the art can readily identify the necessary modifications to the devices proposed in the case where a low confidence level is indicated by the 0-logic value instead of the 1-logic value as in the previous examples.

The invention claimed is:

1. A device for correcting an initial binary word affected by an error in 1 or 2 bits and arising from a correction code with a minimum Hamming distance of 3 or 4, the device comprising:
   a first correction and detection means for correcting an error of 1 bit and for detecting an error of more than 1 bit in the initial word,
   a second means for correcting an error of 1 bit in a word coming from an inversion module, the inversion module configured to:
      receive a data item indicating a binary level of confidence assigned to each of the bits of at least one part of the initial word, and
      invert the bits of the initial word that are assigned the low confidence level to form an intermediate word; and
   a multiplexer with at least two inputs driven by the first correction and detection means the multiplexer configured to receive on a first input by an output of the first correction and detection means and on a second input by an output of the second correction means the first correction and detection means configured to generate a control signal to select the output of the second correction means when the first correction and detection detects an error of more than 1 bit in the initial word, and otherwise select the output of the first correction and detection means, wherein the output of the first correction and detection means is based on the initial word and the output of the second correction means is based on the intermediate word.

2. The device for correcting an initial word as claimed in claim 1, wherein the second correction means is configured to correct a single error and to detect an error of more than 1 bit, outputs of the second correction means being combined to generate a signal indicating an uncorrectable error when the first correction and detection means has detected an error of more than 1 bit.

3. The device as claimed in claim 2, wherein the first correction and detection means is configured to detect errors affecting more than two bits which are characterized by a non-zero syndrome which is different from syndromes corresponding to a single error.

4. A memory module comprising a device as claimed in claim 3.

5. The device as claimed in claim 1, wherein the first correction and detection means is configured to detect errors affecting more than two bits which are characterized by a non-zero syndrome which is different from syndromes corresponding to a single error.

6. A memory module comprising a device as claimed in claim 5.

7. A memory module comprising a device as claimed in claim 1.

* * * * *